United States Patent [19]
Chang et al.

[11] Patent Number: 5,723,373
[45] Date of Patent: Mar. 3, 1998

[54] METHOD OF MAKING POROUS-SI CAPACITORS FOR HIGH DENSITY DRAMS CELL

[75] Inventors: Yih-Jau Chang; Shye-Lin Wu, both of Hsinchu, Taiwan

[73] Assignee: Powerchip Semiconductor Corp., Hsinchu, Taiwan

[21] Appl. No.: 746,857

[22] Filed: Nov. 18, 1996

[51] Int. Cl.⁶ ............................................ H01L 21/8242
[52] U.S. Cl. ................................................ 438/253; 438/255
[58] Field of Search ..................................... 438/253, 255

[56] References Cited

U.S. PATENT DOCUMENTS 5,256,587  10/1993  Jun et al. ............................ 437/52
5,350,707  9/1994   Ko et al. ............................. 437/52
5,354,705  10/1994  Mathews et al. ..................... 437/52

*Primary Examiner*—Jey Tsai
*Attorney, Agent, or Firm*—Ladas & Parry

[57] ABSTRACT

The present invention is a method of manufacturing porous-Si capacitors for use in semiconductor memories. The present invention uses a silicon oxide layer as an etching mask to etch a polysilicon layer to form a porous-Si structure. The etching process is performed to etch a portion of the polysilicon layer and to etch away the remaining HSG-Si. Next, an oxide layer which is in micro grooves is removed to define a porous-Si bottom storage. The present invention can be used to increase the surface area of the capacitor.

31 Claims, 4 Drawing Sheets

METHOD OF MAKING POROUS-SI CAPACITORS FOR HIGH DENSITY DRAMS CELL

The present invention relates to semiconductor capacitors, and more specifically, to a method of making a porous-Si capacitor DRAM cell.

BACKGROUND OF THE INVENTION

Dynamic Random Access Memory (DRAM) devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively. The other terminal of the capacitor is connected to a reference voltage. The formation of a DRAM memory cell comprises the formation of a transistor, a capacitor and contacts to external circuits. The capacitor type that has been typically used in DRAM memory cells are planar capacitors, because they are relatively simple to manufacture.

With the advent of Ultra Large Scale Integrated (ULSI) DRAM devices, the sizes of memory cells have gotten smaller and smaller such that the area available for a single memory cell has become very small. This has caused a reduction in capacitor area, which in turn results in a reduction in cell capacitance. Planar capacitors have been traditionally used, due to their ease of manufacture, but as the memory cells decrease in size, the area of the planar capacitance also decrease. For very small memory cells, planar capacitor becomes very difficult to use reliably. Specifically, as the size of the capacitor decreases, the capacitance of the capacitor also decreases and the amount of the charge capable of being stored by the capacitor similarly decreases. This results in the capacitor being very susceptible to α particle interference. Additionally, as the capacitance decreases, the charge held by storage capacitor must be refreshed often. A simple stacked capacitor can not provide sufficient capacitance, even though high dielectric $Ta_2O_5$ is used as the insulator between the plates of the capacitor.

Prior art approaches to overcoming these problems have resulted in the development Of the trench capacitor (see for example U.S. Pat. No. 5,374,580) and the stacked capacitor (see for example U.S. Pat. No. 5,021,357). The trench capacitor has the well known problem of "gated diode leakage," which is the leakage of current resulting in the trench capacitor failing to hold a charge. Further, a cylindrical capacitor using Hemispherical Grained Si has been proposed (see "A New Cylindrical Capacitor Using Hemispherical Grained Si For 256 Mb DRAMs", FI. Watanabe et al., Tech Dig, December 1992, pp.259–262). Reducing the thickness of the dielectric also can improve the capacitance of the capacitor, but this approach is limited because of yield and reliability problems associated with using very thin dielectric materials. Moreover, once a better capacitor structure is proposed, its capacitance can be further improved by either using a thinner dielectric insulator or by selecting an insulator having higher dielectric constant.

A capacitor-over-bit-line (COB) cell with a hemispherical-grain (HSG-Si) polysilicon storage node has been developed (see "Capacitor Over Bit Line Cell With Hemispherical Grain Storage Node For 64 Mb DRAMs", M. Sakao et al., microelectronics research laboratories, NEC Corporation. "A Capacitor Over Bit Line Cell With A Hemispherical Grain Storage Node For 64 Mb DRAMs", IEDM Tech Dig., December 1990, pp 655–658). The HSG-Si is deposited by low pressure chemical vapor deposition method at the transition temperature from amorphous Si to polycrystalline Si. This memory cell provides large storage capacitance by increasing the effective surface area of a simple storage node and is manufactured by optical delineation. The HSG-Si storage node can be fabricated by addition of two process steps, i.e. HSG-Si deposition and a etchback. A HSG-Si electrode node has been proposed (see "New Cylindrical Capacitor Using Hemispherical Grain Si For 256 Mb DRAMs", H. Watanabe et al., microelectronics research laboratories, NEC Corporation). After the electrode structure is formed, a native-oxide on the electrode surface is removed by a diluted HF solution. HSG-Si appeared on silicon surface using seeding method".

SUMMARY OF THE INVENTION

The present invention provides a method of making capacitors with enlarged surface areas. The formation of the porous-Si capacitor described herein includes many process steps that are well known in the art such as patterning and etching, and thus such steps are not described herein detail.

A first dielectric layer is formed over the semiconductor substrate. Next, a second dielectric layer is deposited on the first dielectric layer to serve as a etching barrier for subsequent process. In preferred embodiment, the second dielectric layer is formed of nitride. A contact hole is formed in the first dielectric layer and the second dielectric layer. A first polysilicon layer is generated over and in the contact hole and on the second dielectric layer. An undoped HemiSpherical Grains silicon (HSG-Si) layer is formed on the first polysilicon layer.

Next, a slight etch is used to separate or better define the silicon islands of the HSG-Si layer and etch the first polysilicon layer by using the HSG-Si layer as a mask to form a plurality of small holes on the surface of the first polysilicon layer. Residual HSG-Si islands are left on the polysilicon layer after the procedure. Subsequently, a thin layer of silicon oxide is formed on exposed portion of the polysilicon layer and along the surface of the grooves by using a low temperature wet oxidation process. A dry etching is used to etch the silicon oxide layer to expose the top of the HSG-Si. Next, an etching process is performed by using the residual silicon oxide as a mask to etch a portion of the first polysilicon layer, the HSG-Si. The HSG-Si is completely removed during this etching process. An isotropic etching is used to create deeper holes in the first polysilicon layer. A porous-Si bottom storage node is formed after the residual silicon oxide layer is stripped away. Then the second dielectric layer is removed by wet etching. A dielectric film is deposited along the surface of the first conductive layers. Finally, a second polysilicon layer is deposited using a conventional LPCVD process over the dielectric film to define a second plate of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

Detailed Description of the Preferred Embodiment

The formation of the porous-Si capacitor described herein includes many process steps that are well known in the art. For example, the processes of photolithography masking and etching are well known in the art and are used extensively herein without a related discussion of these well known technologies.

In addition, the present invention uses residual oxide as an etching mask to form a porous-Si capacitor structure. Further more, the high etching selectivity between oxide and polysilicon (the relative susceptibility is about 100 to 1) is used to form the porous-Si capacitor.

In preferred embodiment, a single crystal silicon substrate with a <100> crystallographic orientation, is provided. A thick field oxide (FOX) region is formed to provide isolation between devices on the substrate. The FOX region is created in a conventional manner. For example, the FOX region can be formed via photolithography and dry etching steps to etch a silicon nitride-silicon dioxide composition layer. After the photoresist is removed and wet cleaned, thermal oxidation in an oxygen-steam environment is used to grow the FOX region to a thickness of about 3000–8000 angstroms.

Next, a silicon dioxide layer is created on the top surface of the substrate to serve as the gate oxide for subsequently formed Metal Oxide Silicon Field Effect Transistors (MOSFETs). In one embodiment, the silicon dioxide layer is formed by using an oxygen-steam ambient, at a temperature of about 800°–1100° C. Alternatively, the oxide layer may be formed using any suitable oxide chemical compositions and procedures. In this embodiment, the thickness of the silicon dioxide layer is approximately 30–200 angstroms.

A doped polysilicon layer is then formed over the FOX region and the silicon dioxide layer using a Low Pressure Chemical Vapor Deposition process. In this embodiment, the thickness of the first polysilicon layer is about 500–2000 angstroms. A tungsten silicide layer is formed on the first polysilicon layer. Next, standard photolithography and etching steps are used to form a gate structure and a local interconnection. Subsequently, active regions (i.e. the source and the drain) are formed by using well known processes to implant appropriate impurities in those regions. Then a metal layer is formed on the substrate, well known patterning and etching processes are used to etching the metal layer to form a bit line.

Figure 1:
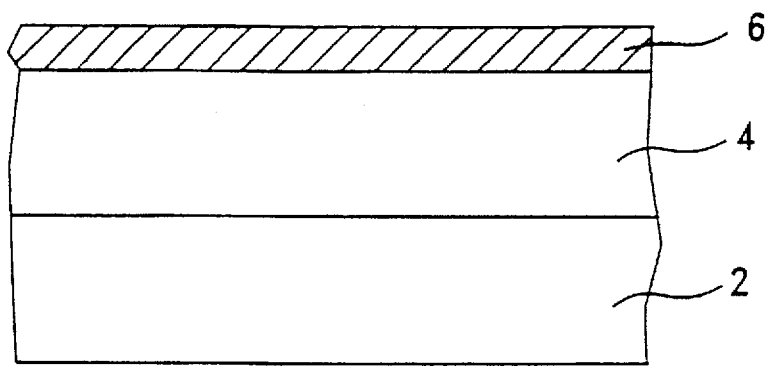
FIG. 1 is a cross section view of a semiconductor wafer illustrating the step of forming a first dielectric layer and a second dielectric layer on a semiconductor substrate.

Turning to FIG. 1, a first dielectric layer 4 is formed over the semiconductor substrate 2. The first dielectric layer 4 is preferably formed by using suitable material such as borophosphosilicate glass (BPSG) or TEOS-oxide. Next, a second dielectric layer 6 is deposited on the first dielectric layer to serve as a barrier to prevent the first dielectric layer 4 from etching for subsequent process. The second dielectric layer 6, if used, is preferably formed of different material, such as nitride. The thickness of the second dielectric layer 6 is preferably about 500–2000 angstroms.

Figure 2:
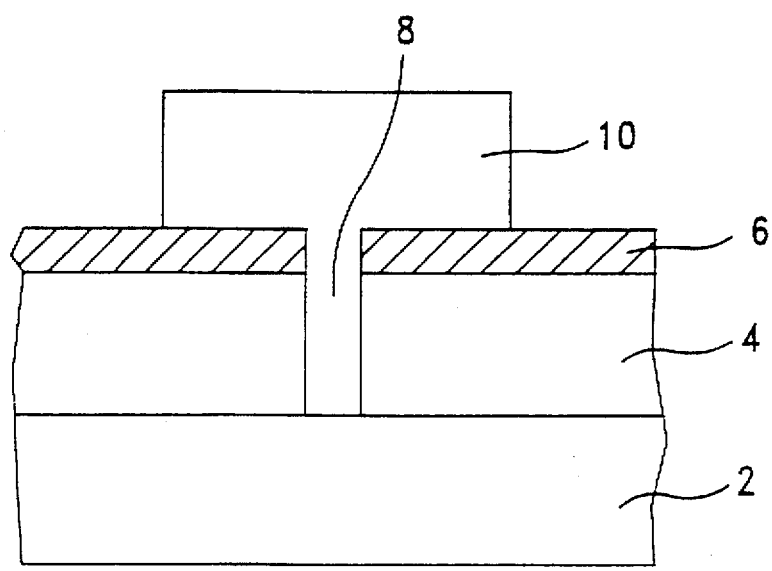
FIG. 2 is a cross section view of a semiconductor wafer illustrating the step of forming a first polysilicon layer on the semiconductor substrate.

As shown in FIG. 2, a contact hole 8 is formed in the first dielectric layer 4 and in the second dielectric layer 6 by patterning and etching. A first conductive layer 10 is formed over and in the contact hole 8 and on the second dielectric layer 6. The first conductive layer 10 is preferably formed using conventional LPCVD processing. The thickness of the first conductive layer 10, as measured over the second dielectric layer 6, is preferably in the range of 3000–10000 angstroms. The first conductive layer 10 is preferably either doped polysilicon or in-situ doped polysilicon. A photoresist is patterned on the first conductive layer 10 and then an etching process is utilized, using the photoresist as an etching mask to etch the first conductive layer 10. Then the photoresist is stripped away.

Figure 3:
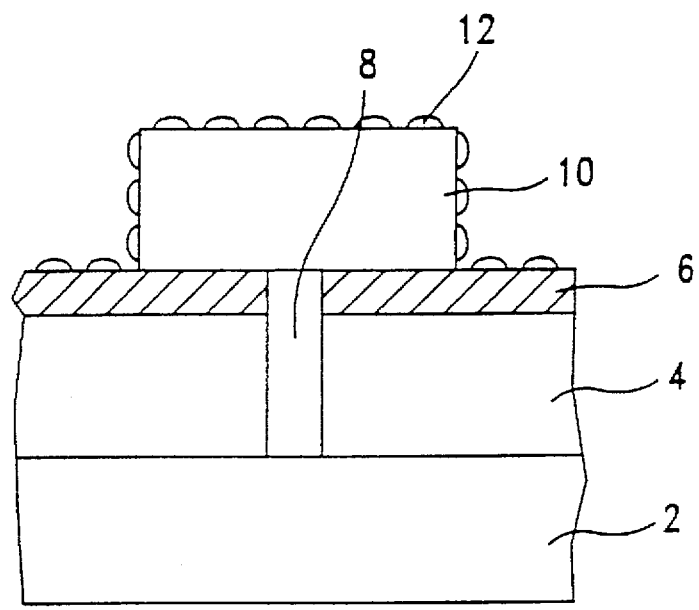
FIG. 3 is a cross section view of a semiconductor wafer illustrating the step of forming a HSG-Si layer on the first polysilicon layer.

Turning now to FIG. 3, an undoped HemiSpherical Grains silicon (HSG-Si) layer 12 is formed on the first conductive layer 10 to have a thickness of a range about 300–1000 angstroms.

Figure 4:
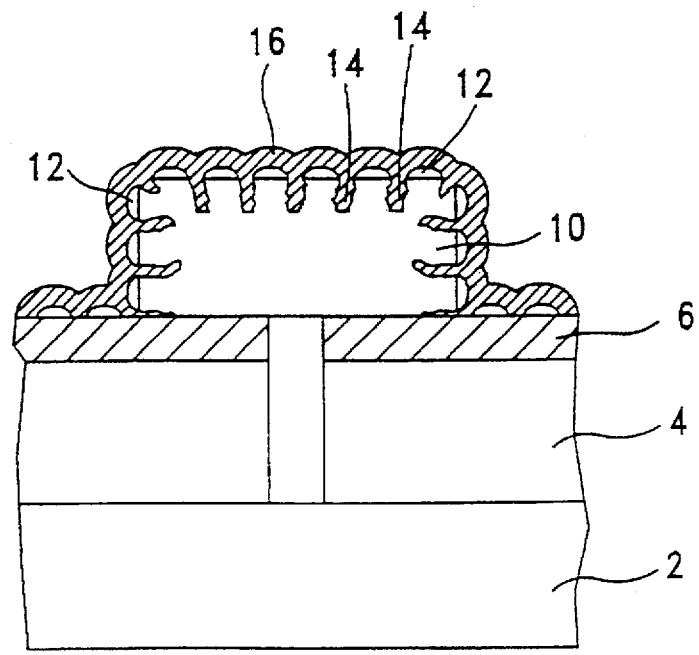
FIG. 4 is a cross section view of a semiconductor wafer illustrating the step of growing a silicon oxide layer on the first polysilicon layer and forming micro grooves in the first polysilicon layer, the grooves are filled with oxide.

Turning next to FIG. 4, a slight etch is used to etch the first conductive layer 10 by using the HSG-Si layer 12 as a mask to form a rugged surface of the first conductive layer 10. In other words, a plurality of micro grooves 14 are created in the first conductive layer 10. This procedure causes micro holes 14 to be formed in the polysilicon 10 which have a depth on the order of 100–1000 angstroms. Residual HSG-Si islands are left on the polysilicon layer after the procedure. The etchant of the etching process is $SiCl_4/Cl_2$, $SF_6$, $HBr/O_2$, $BCl_3/Cl_2$. Subsequently, a silicon oxide 16 is formed on the exposed portion of the first conductive layer 10, along the surface of the micro grooves 14 and on the HSG-Si layer 12 preferably by using low temperature wet oxidation process in an oxygen ambient. In this embodiment, the oxidation temperature is about 700°–950° C. and the oxidation process preferably continues for 10–60 minutes. The silicon oxide layer 16 is formed to have a thickness about 500–3000 angstroms.

Figure 5:
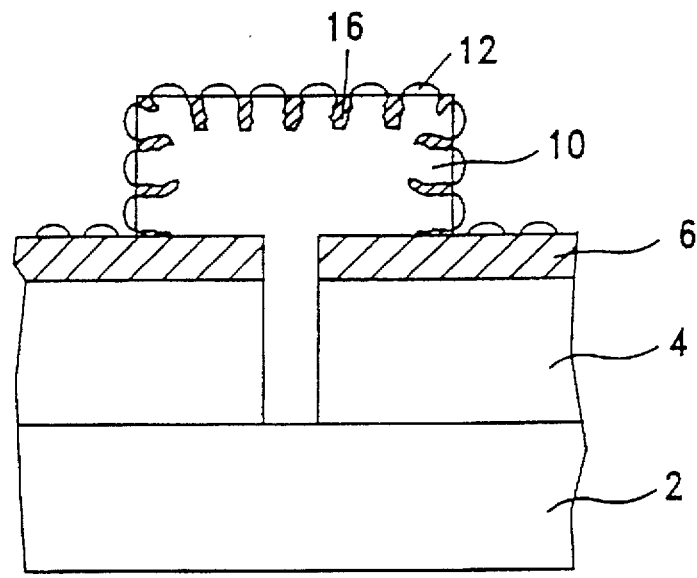
FIG. 5 is a cross section view of a semiconductor wafer illustrating the step of etching the silicon oxide layer to expose the top of the HSG-Si.

Next, as can be seen by reference to FIG. 5, a dry etching is used to etch the silicon oxide layer 16 to expose the tops of islands in the HSG-Si layer 12. The high etching selectivity between oxide and polysilicon (the relative susceptibility is about 100 to 1) is used to achieve this end. Some of the silicon oxide layer 16 is left in the micro grooves 14 after the etching process.

Figure 6:
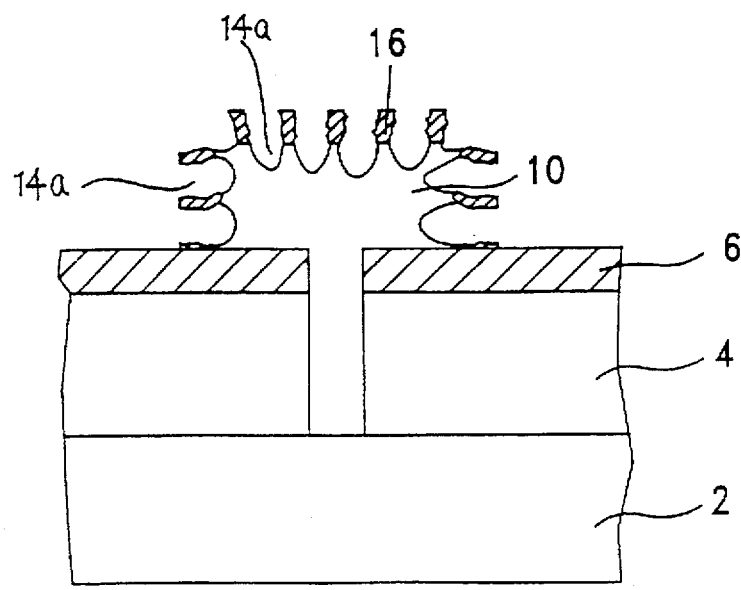
FIG. 6 is a cross section view of a semiconductor wafer illustrating the step of etching the first polysilicon layer and the HSG-Si.
Figure 7:
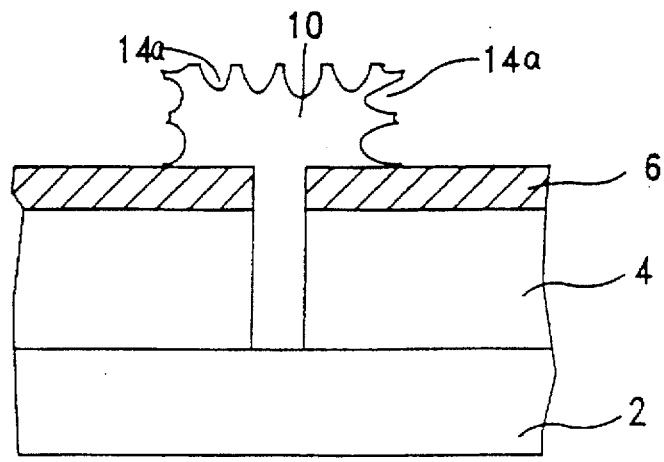
FIG. 7 is a cross section view of a semiconductor wafer illustrating the step of removing the silicon oxide layer.

As shown in FIG. 6, a dry isotropic etching process is performed using the residual silicon oxide 16 as a mask to etch the HSG-Si layer 12 into a portion of the first conductive layer 10. Preferably, the etchant of the etching is $CHF_3/O_2$, $CH_4/O_2$. The HSG-Si 12 and is completely removed during this etching process. The present invention uses this isotropic etching to create relatively deeper holes 14a in the first conductive layer 10 adjacent the masking oxide in the first conductive layer 10. These deeper holes 14a give the first conductive layer 10 a gouged-out quality and, of course, increases the surface area. As shown in FIG. 7, any remaining oxide in the former small grooves 14 should be stripped away using a suitable etchant, such as BOE or diluted HF solution.

Figure 8:
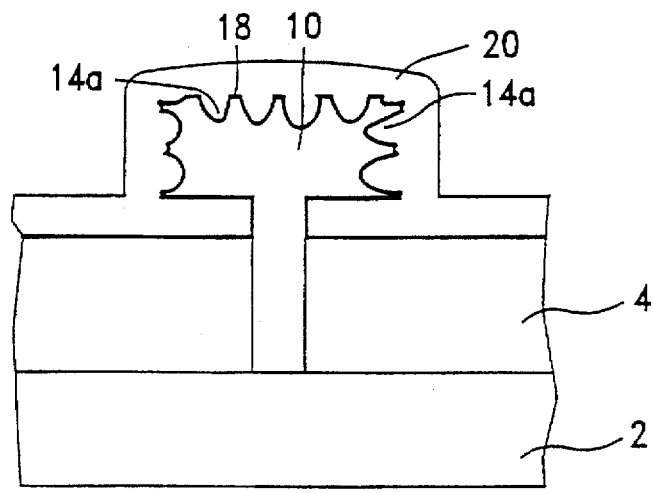
FIG. 8 is a cross section view of a semiconductor wafer illustrating the step of removing the second dielectric layer, forming a dielectric film and the second conductive layer along the surface of the first polysilicon layer.

Referring to FIG. 8, the second dielectric layer 6, if utilized, is preferably removed by a wet etching. In preferred embodiment, the etchant is preferably hot phosphoric acid, which dissolves layer 6 but not layer 4. A dielectric film 18 is then deposited on the exposed surface of the first conductive layers 10. The dielectric film 18 is preferably formed of either a double film of nitride/oxide film, a triple film of oxide/nitride/oxide or any other high dielectric film such as tantalum oxide($Ta_2O_5$), BST, PZT. If $Ta_2O_5$, BST, PZT are used as the dielectric film 18, then a composition layer which is composed of barrier metal layer/metal layer must be formed on the first conductive layers 10 before the dielectric film 18 is formed. It is because that these dielectric films must be used in a metal-insulator-metal (MIM) structure. Further, if a layer 6 is utilized and dissolved, as is preferred, then the dielectric wraps around the gouged-out surface and under much of the lower surface of conductive layer 10, thereby increasing further the surface area of the first plate of this capacitor which is being formed. Of course, if a layer 6 is utilized (and removed as suggested), then the column under the block of poly formed by the conductive layer 10 must be sized to adequately following processing steps. Otherwise, poly blocks may fall away or tip during the subsequent processing steps causing yield rates to drop. After the dielectric film 18 is deposited, a second conductive layer 20 is deposited using a conventional LPCVD process over the dielectric film 18. The second conductive layer 20 provides a top storage electrode and is formed of doped polysilicon, in-situ doped polysilicon, aluminum, copper, tungsten or titanium. In addition, if $Ta_2O_5$, BST, PZT, PLZT are used to serve as the dielectric film 18, then the second conductive layer 20 must be metal to form a metal-insulator-metal (MIM) structure. Thus, a semiconductor capacitor is formed which comprises a second conductive layer 20 as its top storage electrode, a dielectric 18, and a first conductive layer 10 as the bottom storage electrode.

Figure 9:
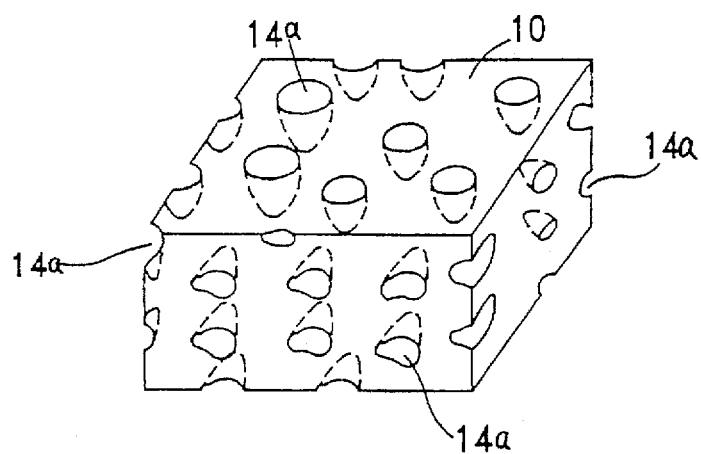
FIG. 9 is a three dimension drawing of a porous-Si bottom storage node.

FIG. 9 shows the three dimension drawing of the porous-Si bottom storage node. It can be seen, a plurality of holes 14a are generated in the first conductive layer 10. The holes 14a are randomly generated on the five exposed surfaces of the first storage node and effectively increase the surface area of the first storage node without increasing its physical dimensions.

The present invention thus provides capacitors with an enlarged surface area. The porous-Si capacitor structure increases the surface area of the capacitor. Therefore the present invention increases the performance of the capacitor.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a capacitor on a semiconductor substrate, said method comprising the steps of:

forming a dielectric layer on said semiconductor substrate;

forming a polysilicon layer over said dielectric layer;

patterning a photoresist on said polysilicon layer;

etching said polysilicon layer using said photoresist as a mask;

removing said photoresist;

forming a HSG-Si layer on said polysilicon layer;

etching said polysilicon layer while using said HSG-Si layer as a mask to create a plurality of grooves in said polysilicon layer, residual HSG-Si islands remaining on said polysilicon layer after etching said polysilicon layer;

forming a silicon oxide layer on said polysilicon layer, said residual HSG-Si islands and in said grooves;

etching said silicon oxide layer to expose the top of said residual HSG-Si islands leaving residual silicon oxide in said grooves;

isotropically etching using said residual silicon oxide as a mask to etch said HSG-Si islands and also into said polysilicon layer to thereby form a plurality of holes in said polysilicon layer;

removing said residual silicon oxide;

forming a dielectric film on the surface of said polysilicon layer; and forming a conductive layer over said dielectric film to formed said capacitor.

2. The method of claim 1, wherein the step of forming said dielectric layer comprises forming first and second dielectric layers, said first dielectric layer being on said substrate and said second dielectric layer being on said first dielectric layer, and then after said residual oxide which has been removed, removing said second dielectric layer.

3. The method of claim 2, further including etching said first dielectric layer and said second dielectric layer to define a contact hole therein and wherein said polysilicon layer is formed in said contact hole.

4. The method of claim 3, wherein said first dielectric layer comprises TEOS-oxide.

5. The method of claim 3, wherein said second dielectric layer comprises nitride.

6. The method of claim 5, wherein said nitride has a thickness in a range of about 500–2000 angstroms.

7. The method of claim 1, wherein said polysilicon layer has a thickness in a range of about 3000–10000 angstroms.

8. The method of claim 7, wherein said polysilicon layer is chosen from the group consisting of doped polysilicon and in-situ doped polysilicon.

9. The method of claim 1, wherein said HSG-Si is undoped polysilicon.

10. The method of claim 1, wherein said silicon oxide layer is formed by a low temperature wet oxidation process.

11. The method of claim 10, wherein the temperature of said thermal oxidation is about 700°–950° C.

12. The method of claim 1, wherein said HSG-Si layer is formed to have a thickness of a range about 300–2000 angstroms.

13. The method of claim 1, wherein said silicon oxide layer is formed to have a thickness of a range about 200–2000 angstroms.

14. The method of claim 1, wherein said dielectric film is formed of a triple film of oxide/nitride/oxide.

15. The method of claim 1, wherein said dielectric film is formed of a double film of nitride/oxide film.

16. The method of claim 1, further comprising the following steps before forming said dielectric film:

forming a barrier metal on said first conductive layer; and forming a metal layer on said barrier metal layer.

17. The method of claim 16, wherein said conductive layer is formed of metal.

18. The method of claim 17, wherein said dielectric film is formed of tantalum oxide($Ta_2O_5$).

19. The method of claim 17, wherein said dielectric film is formed of BST.

20. The method of claim 17, wherein said dielectric film is formed of PZT.

21. The method of claim 17, wherein said dielectric film is formed of PLZT.

22. The method of claim 1, wherein said polysilicon layer is chosen from the group consisting of doped polysilicon and in-situ doped polysilicon.

23. A method of forming holes in a silicon structure, said method comprising the steps of:

forming a polysilicon layer over said substrate;

forming a HSG-Si layer on said polysilicon layer;

etching said polysilicon layer by using said HSG-Si layer as a mask to create a plurality of grooves in said polysilicon layer, residual HSG-Si islands are left on said polysilicon layer after etching said polysilicon layer:

forming a silicon oxide layer on said polysilicon layer, said residual HSG-Si islands and in said grooves;

etching said silicon oxide layer to expose the top of said residual HSG-Si islands leaving residual silicon oxide layer in said grooves; and isotropically etching using said residual silicon oxide layer as a mask to etch said HSG-Si islands and also into said polysilicon layer to thereby form a plurality of holes in said polysilicon layer.

24. The method of claim 23, wherein said polysilicon layer has a thickness in a range of about 3000–10000 angstroms.

25. The method of claim 23, wherein said polysilicon layer is chosen from the group of doped polysilicon or in-situ doped polysilicon.

26. The method of claim 23, wherein said HSG-Si is undoped.

27. The method of claim 23, wherein said silicon oxide layer is formed by a low temperature wet oxidation process.

28. The method of claim 23, wherein the temperature of said thermal oxidation is about 700°–950° C.

29. The method of claim 23, wherein said HSG-Si layer is formed to have a thickness of a range about 300–3000 angstroms.

30. The method of claim 23, wherein said silicon oxide layer is formed to have a thickness of a range about 200–2000 angstroms.

31. A method of forming holes in a silicon structure, said method comprising the steps forming a dielectric layer on said semiconductor substrate;

forming a polysilicon layer over said first dielectric layer;

patterning a photoresist on said polysilicon layer, etching said polysilicon layer using said photoresist as a mask;

removing said photoresist;

forming a HSG-Si layer on said polysilicon layer;

etching said polysilicon layer by using said HSG-Si layer as a mask to create a plurality of grooves in said polysilicon layer, residual HSG-Si islands are left on said polysilicon layer after etching said polysilicon layer;

forming a silicon oxide layer on said polysilicon layer, said residual HSG-Si islands and in said grooves;

etching said silicon oxide layer to expose said residual HSG-Si islands leaving residual silicon oxide layer in said holes;

isotropically etching using said residual silicon oxide layer as a mask to etch said polysilicon layer and said HSG-Si islands to form a plurality of small holes in said polysilicon layer.

\* \* \* \* \*